United States Patent
Devarajan et al.

(10) Patent No.: US 7,301,746 B2
(45) Date of Patent: Nov. 27, 2007

(54) THERMAL SHUTDOWN TRIP POINT MODIFICATION DURING CURRENT LIMIT

(75) Inventors: Vijayalakshmi Devarajan, Dallas, TX (US); John H. Carpenter, Jr., Rowlett, TX (US); Benjamin Lee Amey, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 282 days.

(21) Appl. No.: 11/232,071

(22) Filed: Sep. 21, 2005

(65) Prior Publication Data

US 2007/0064369 A1    Mar. 22, 2007

(51) Int. Cl.
    $H02H\ 5/04$    (2006.01)
(52) U.S. Cl. .................................... 361/103
(58) Field of Classification Search ................ 361/103, 361/93.8
    See application file for complete search history.

(56) References Cited

U.S. PATENT DOCUMENTS

| | | | | |
|---|---|---|---|---|
| 4,667,121 A | * | 5/1987 | Fay et al. ................ | 327/83 |
| 5,128,823 A | * | 7/1992 | Fujimoto et al. .......... | 361/93.9 |
| 5,737,170 A | * | 4/1998 | Moyer ...................... | 361/103 |
| 5,801,573 A | * | 9/1998 | Kelly et al. ............... | 327/434 |
| 6,816,351 B1 | * | 11/2004 | Frank et al. ............... | 361/103 |
| 2006/0056485 A1 | * | 3/2006 | Hartley ..................... | 374/170 |

* cited by examiner

*Primary Examiner*—Michael Sherry
*Assistant Examiner*—Boris Benenson
(74) *Attorney, Agent, or Firm*—J. Dennis Moore; W. James Brady, III; Frederick J. Telecky, Jr.

(57) ABSTRACT

A thermal shutdown circuit for protecting a main FET that conducts a load current ILOAD. A reference circuit provides a temperature current proportional to temperature. A thermal sensor circuit has a resistor and generates an output signal signaling thermal shutdown when the voltage generated across the resistor by the temperature current exceeds a predetermined value. A sense FET having a size smaller than the main FET conducts a sense current ISENSE proportionately smaller than ILOAD. A current mirror mirrors a scaled current proportional to ISENSE to be conducted through the resistor, the scaled current being scaled so as to cause the voltage generated across the resistor to exceed the predetermined value when ILOAD exceeds a predetermined value.

6 Claims, 2 Drawing Sheets

THERMAL SHUTDOWN TRIP POINT MODIFICATION DURING CURRENT LIMIT

TECHNICAL FIELD OF THE INVENTION

The present invention relates to thermal shutdown circuits, and more particularly relates to a circuit and method for enhancing the effectiveness of such circuits.

BACKGROUND OF THE INVENTION

Thermal shutdown ("TSD") circuits are used to shut down a particular module within an integrated circuit ("IC") when the temperature of that module exceeds a certain temperature. One of the ways such circuits are implemented is as follows. A reference circuit generates current that is proportional to absolute temperature ("IPTAT"). This IPTAT current is fed into a thermal sensor, which is typically a bipolar transistor and a resistor. An example 10 of such a prior art circuit is shown in FIG. 1. The Reference circuit 11 is a well-known circuit for generating a PTAT current via the difference between current densities through transistors $Q_1$ and $Q_2$, which have a ratio of emitter areas of 1:N. PFET transistor devices MP1 and MP2 are configured as a current mirror, and mirror the PTAT current to PFET transistor device MP3 in the Thermal Sensor circuit 12. The PTAT current is conducted through resistor $R_2$ in Thermal Sensor circuit 12, which establishes a voltage Va at the base of bipolar transistor $Q_3$. FIG. 2 is a graph of voltage versus temperature showing plots for Va versus temperature and of the base-emitter voltage Vbe of transistor $Q_3$ versus temperature. When Va exceeds the Vbe, transistor $Q_3$ turns on, overcoming the pull-up function of current source M and pulling the normally high level TSD OUT signal down, thus signaling thermal shutdown.

Some modules that are provided with a TSD circuit have an FET that is designed for relatively low ON resistance, which requires that the size of the FET be relatively large. The drains of such FET devices are typically connected to an external pin of the IC. During normal operation, the drain is tied to a power supply through a load, which has a selected resistance. In such configurations, a fault condition can occur in which the drain gets short circuited to the power supply without the load. If the FET is in the ON state when this type of fault condition occurs, a large amount of current flows through the FET, limited only by its size. For this reason, a current limit circuit is frequently implemented to deal with this situation. The current limit circuit uses a sense FET the size of which is a fraction of that of the FET being protected. Therefore, the current through the sense FET is likewise a fraction of that through the FET being protected. When the current through the sense FET exceeds a set value, the current limit circuit operates on the gate voltage of the FET being protected to limit the current through it.

In cases where the current limit value is set high, at the time that this kind of fault condition occurs, a large amount of power is instantaneously dissipated in the FET being protected. This causes highly localized heating. The heat from the center of the FET radiates to the TSD circuit, and, as described above, when the temperature of the TSD circuit reaches its trip point, the TSD OUT signal changes state, causing shut-down of the module. If the temperature of the TSD circuit is relatively low when the fault occurs, it takes relatively longer for it to reach its trip point, and in the meantime, the highly localized heating in the FET being protected could damage it.

It would be desirable to have a TSD circuit that is less susceptible to this kind of failure in its protective function.

SUMMARY OF THE INVENTION

The present invention provides a thermal shutdown circuit for protecting a main FET that conducts a load current ILOAD. A reference circuit provides a temperature current proportional to temperature. A thermal sensor circuit has a resistor and generates an output signal signaling thermal shutdown when the voltage generated across the resistor by the temperature current exceeds a predetermined value. A sense FET having a size smaller than the main FET conducts a sense current ISENSE proportionately smaller than ILOAD. A current mirror mirrors a scaled current proportional to ISENSE to be conducted through the resistor, the scaled current being scaled so as to cause the voltage generated across the resistor to exceed the predetermined value when ILOAD exceeds a predetermined value.

These and other aspects and features of the invention will be apparent to those skilled in the art from the following detailed description of the invention, taken together with the accompanying drawings.

BRIEF DESCRIPTION OF THE DRAWINGS

FIG. 4 is a graph like that of FIG. 2, but also showing a plot of.

DETAILED DESCRIPTION OF THE PREFERRED EMBODIMENT

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

In the failure mode described in the Background, the problem is that the TSD circuit can take too long to reach its trip point temperature for it to operate on the gate of the FET being protected to save it from damage. In accordance with the principles of the present invention, a portion of the current from the sense FET is mirrored into the thermal sensor along with the PTAT current. In this way, when the FET being protected is conducting a large amount of current, a significant amount of current from the sense FET is conducted into the thermal sensor, thus lowering its trip point. As a result, the thermal sensor can shut down the FET being protected more quickly.

Figure 1:
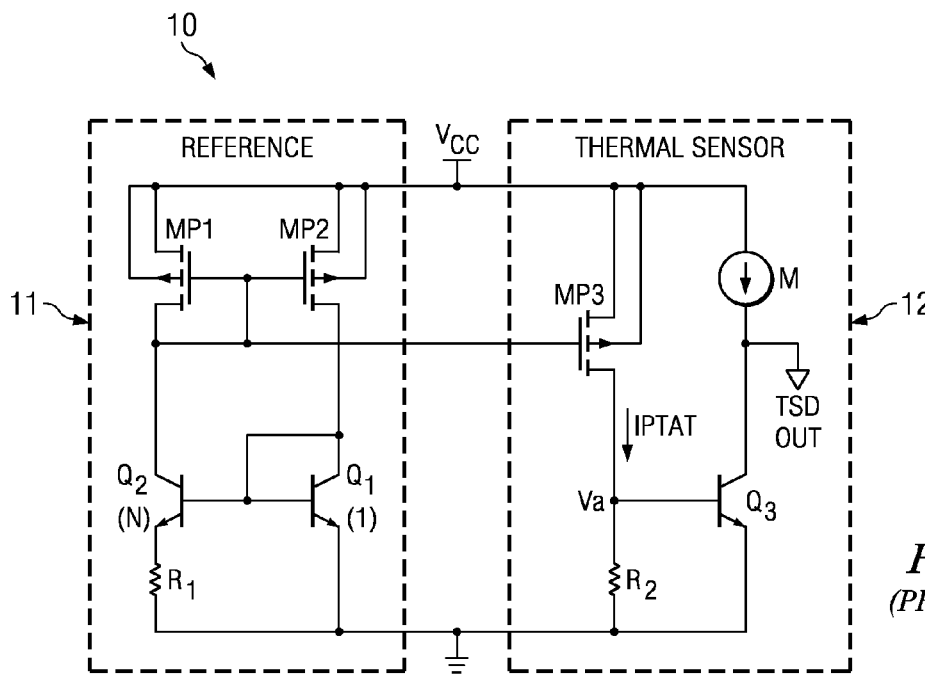
FIG. 1 is a circuit diagram of a typical prior art thermal shutdown circuit.
Figure 3:
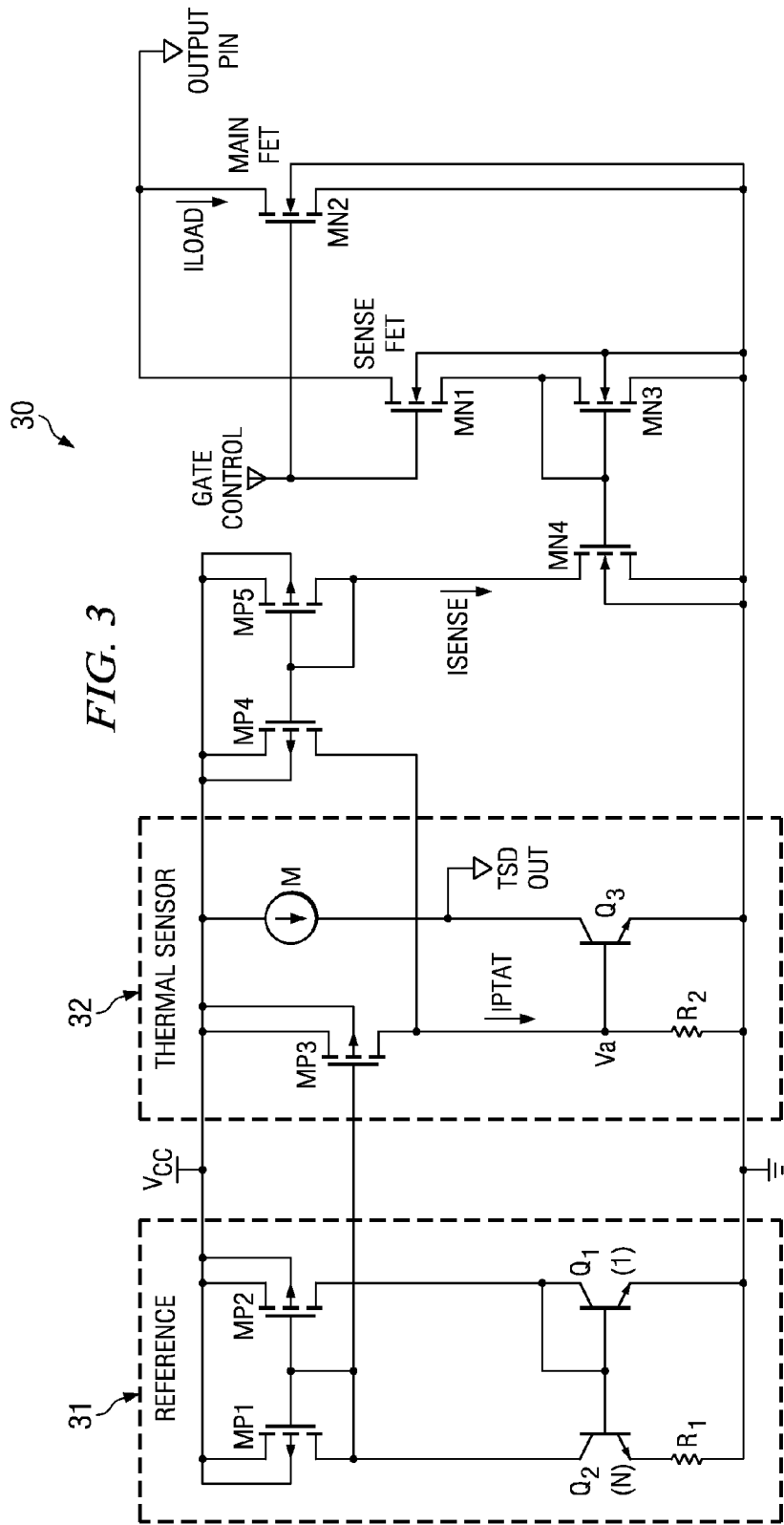
FIG. 3 is a circuit diagram of a thermal shutdown circuit according to a preferred embodiment of the present invention.

FIG. 3 is a circuit diagram of an embodiment 30 of the present invention. In it, the Reference circuit 31 and Thermal Sensor circuit 32 are the same as the Reference circuit 11 and Thermal Sensor circuit 12 of FIG. 1. Also shown in the figure are the "Main FET," MN2, i.e., the NMOS FET being protected. NMOS FET MN1 is the Sense FET, and is connected in parallel with the Main FET MN2. As mentioned above, the size of the Sense FET MN1 is a fraction of that of the Main FET MN2, and so the sense current ISENSE conducted through Sense FET MN1 is a fraction of the current ILOAD conducted through the Main FET MN2. NMOS FETs MN3 and MN4 are connected together as a current mirror, as shown, with FET MN3 mirroring the sense current, ISENSE, to FET MN4. PMOS FETs MP4 and MP5 are connected together as a current mirror, as shown, with FET MP5 mirroring the sense current, ISENSE, to FET MP4. This current is conducted through resistor $R_2$ in Thermal Sensor circuit 32 by the source of FET MP4 being connected to the node at which voltage Va is developed. Those of ordinary skill in this art will readily appreciate and understand that the sizes (including width-to-length ratios) of FETs MN1, MN3, MN4, MP5, and MP4 are chosen, in conjunction with the size of resistor $R_2$ to cause voltage Va to be generated at a magnitude that starts to turn ON bipolar transistor $Q_3$ as ILOAD starts to exceed its safe limit for thermal protection. This scaling is done in the context that the scaled and mirrored ISENSE conducted through resistor $R_2$ is in addition to the IPTAT conducted through resistor $R_2$ by the Thermal Sensor circuit 32. Thus, as a sense current ISENSE is developed, corresponding to an ILOAD having a magnitude at which thermal damage can occur to the Main FET MN2, it is immediately mirrored through resistor $R_2$ to thereby immediately bias the base of bipolar transistor $Q_3$ and turn it ON, pulling TSD OUT low, and thus immediately activating the shutdown circuitry (not shown).

Figure 2:
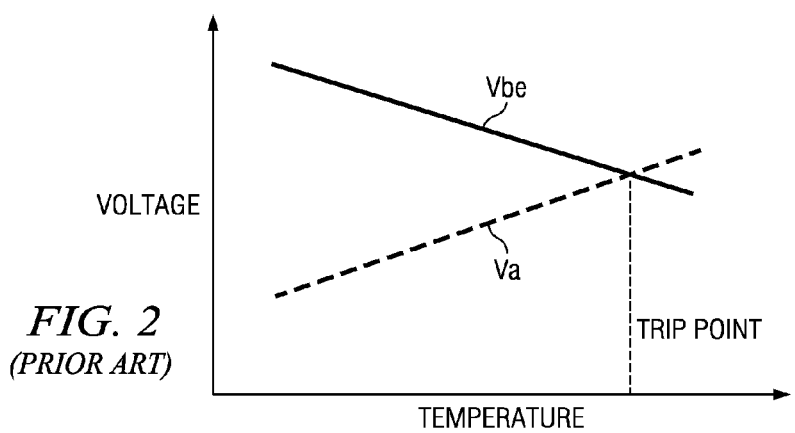
FIG. 2 is a graph showing a plot of Va versus the Vbe of $Q_3$ in FIG. 1, versus temperature.
Figure 4:
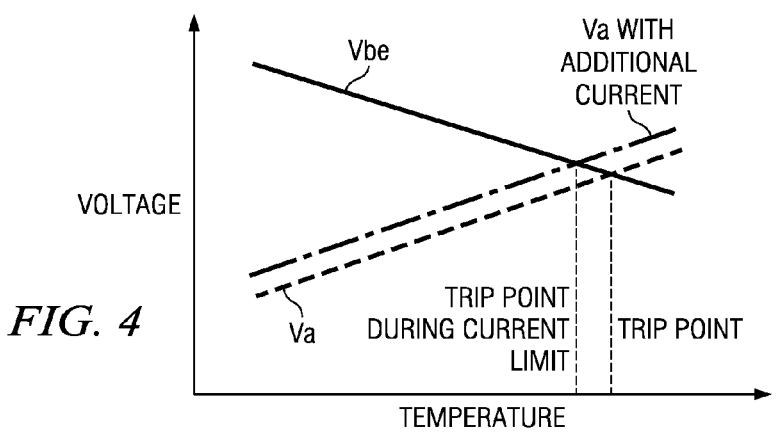

FIG. 4 is a graph of voltage versus temperature showing plots for Va versus temperature and of the base-emitter voltage Vbe of transistor $Q_3$ versus temperature, similar to FIG. 2. However, in FIG. 4 in addition to the plots shown in FIG. 2, a plot is also shown of Va with the additional current contribution. Note that while variations in ILOAD will be reflected in the additional current contributing to Va, with the width-to-length ratios chosen by the designer as described above, only when ISENSE is sufficiently high will it be mirrored well, thus ensuring the desired performance of the circuit.

Although the present invention and its advantages have been described in detail, it should be understood that various changes, substitutions and alterations can be made herein without departing from the spirit and scope of the invention as defined by the appended claims.

What is claimed is:

1. A thermal shutdown circuit for protecting a main FET that conducts a load current ILOAD, comprising:
   a reference circuit providing a temperature current proportional to temperature;
   a thermal sensor circuit having a resistor and generating an output signal signaling thermal shutdown when the voltage generated across the resistor by the temperature current exceeds a predetermined value;
   a sense FET having a size smaller than the main FET for conducting a sense current ISENSE proportionately smaller than ILOAD;
   a first current mirror for mirroring a scaled current proportional to ISENSE to be conducted through the resistor, the scaled current being scaled so as to cause the voltage generated across the resistor to exceed the predetermined value when ILOAD exceeds a predetermined value.

2. A thermal shutdown circuit as in claim 1 wherein the reference circuit provides a PTAT current.

3. A thermal shutdown circuit as in claim 1 wherein the circuit is powered by a power supply having a first side and a second side, and wherein the thermal sensor circuit comprises:
   a semiconductor device having a first terminal and a second terminal for conducting a main current and a third terminal for controlling the flow of the main current; and
   a current source providing a current to flow through the semiconductor device as the main current, and
   wherein the resistor is connected between the third terminal and a side of the power supply.

4. A thermal shutdown circuit as in claim 1 wherein the circuit is powered by a power supply having a first side and a second side, and wherein the sense FET is connected in parallel with the main FET between the sides of the power supply.

5. A thermal shutdown circuit as in claim 4 wherein the first current mirror is connected in series with the sense FET so as to conduct ISENSE for mirroring.

6. A thermal shutdown circuit as in claim 5, further comprising a second current mirror for mirroring and scaling the current mirrored by the first current mirror, connected to conduct the twice mirrored current through the resistor.

* * * * *